(12) United States Patent
Ramanathan et al.

(10) Patent No.: US 10,741,227 B2
(45) Date of Patent: Aug. 11, 2020

(54) CLOCK GENERATING CIRCUITRY

(71) Applicant: Arm Limited, Cambridge (GB)

(72) Inventors: Kumaraswamy Ramanathan, Austin, TX (US); Peixuan Tan, Austin, TX (US); Andy Wangkun Chen, Austin, TX (US)

(73) Assignee: Arm Limited, Cambridge (GB)

( * ) Notice: Subject to any disclaimer, the term of this patent is extended or adjusted under 35 U.S.C. 154(b) by 38 days.

(21) Appl. No.: 16/058,375

(22) Filed: Aug. 8, 2018

(65) Prior Publication Data

US 2020/0051602 A1  Feb. 13, 2020

(51) Int. Cl.
*G11C 8/00* (2006.01)
*G11C 7/22* (2006.01)
*H03K 3/037* (2006.01)

(52) U.S. Cl.
CPC ............. *G11C 7/222* (2013.01); *H03K 3/037* (2013.01)

(58) Field of Classification Search
CPC ................................ G11C 7/222; H03K 3/037
USPC ....................................................... 365/230.05
See application file for complete search history.

(56) References Cited

U.S. PATENT DOCUMENTS

| 7,881,147 B2* | 2/2011 | Chen ..................... G11C 11/419 365/233.1 |
| 2004/0057313 A1* | 3/2004 | Oklobdzija .......... G11C 7/1066 365/205 |
| 2015/0002204 A1* | 1/2015 | Aipperspach .......... H03K 5/145 327/299 |

* cited by examiner

*Primary Examiner* — Vu A Le
(74) *Attorney, Agent, or Firm* — Pramudji Law Group PLLC; Ari Pramudji

(57) ABSTRACT

Various implementations described herein refer to an integrated circuit having a first pulse generator and a second pulse generator. The first pulse generator generates a first clock pulse for a two pulse sequence based on one or more input signals. The second pulse generator is coupled to the first pulse generator and generates a second clock pulse for the two pulse sequence based on the one or more input signals. The second pulse generator has a single stack clock driver that provides an output clock signal having the two pulse sequence.

20 Claims, 9 Drawing Sheets

CLOCK GENERATING CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, memory sub-systems are typically restricted by various load constraints. These memory sub-systems typically utilize conventional clock driver topology that are substantially sized due to a large load that they drive to generate a global timing pulse (GTP) and further due to a cascading effect that the large load has on a slew rate of various derived clocks used for memory operations. Thus, there exists a need to improve clock driver topology that could be used to reduce this loading effect and also reduce area in double-pumped memories.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to pulse generation using clock generating circuitry having a single stack clock driver. Some implementations described herein are related to double-pump pulse generating techniques and schemes for various memory circuit applications. Also, other implementations described herein are related to an area efficient clock driver for a self-time pulse generator. In some instances, the double-pump pulse may be used for read/write sequences within a single clock cycle. In some instances this technique may be applied to a single pulse generator.

As described herein, various implementations provide for a first pulse generator and a second pulse generator. The first pulse generator may be used to generate a first clock pulse for a two pulse sequence based on one or more input signals. The second pulse generator may be coupled to the first pulse generator, and the second pulse generator may be used to generate a second clock pulse for the two pulse sequence based on the one or more input signals. Further, the first pulse generator or the second pulse generator or both may include a single stack clock driver that may be used to provide an output clock signal having the two pulse sequence. In some implementations, as further described herein, the two pulse sequence may refer to a negative global timing pulse (NGTP) for double-pumped memory applications, which may be used for single port memory, dual port memory and/or a multi-port memory.

Various implementations of clock generating circuitry will now be described in detail herein with reference to FIGS. 1-4.

Figure 1:
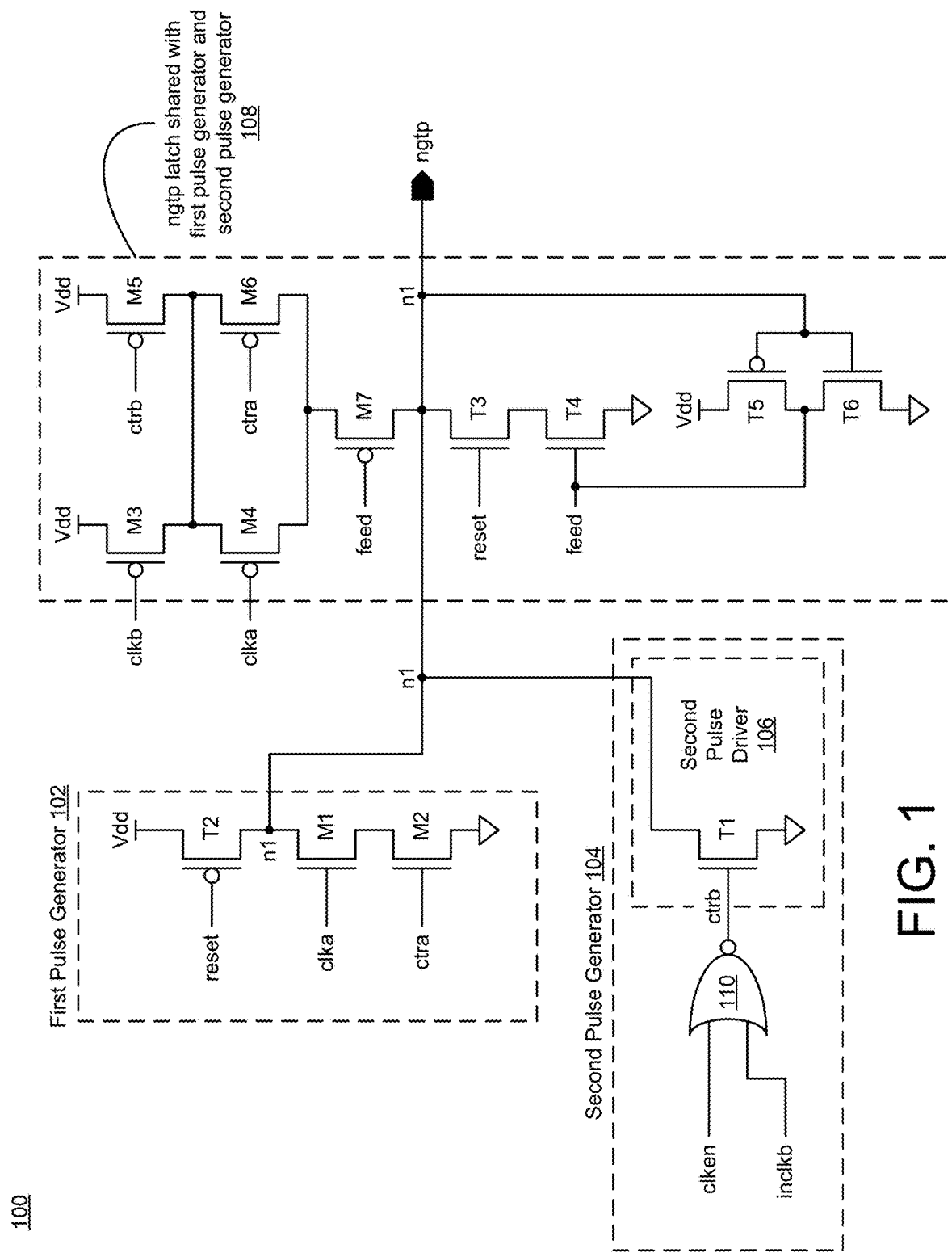
FIG. 1 illustrates a diagram of clock generating circuitry in accordance with various implementations described herein.

FIG. 1 illustrates a diagram of clock generating circuitry 100 in accordance with various implementations described herein.

As shown in FIG. 1, the clock generating circuitry 100 may include a first pulse generator 102 that generates a first clock pulse for a two pulse sequence based on one or more input signals (reset, clka, ctra). As shown, the first pulse generator 102 may include one or more logic devices T2, M1, M2 that are arranged to receive the one or more input signals (reset, clka, ctra) at gates of the one or more logic devices T2, M1, M2 and provide the first clock pulse for the two pulse sequence at node n1. In some instances, the first pulse generator 102 may implement a first NGTP clock generator.

The clock generating circuitry 100 may include a second pulse generator 104 that is coupled to the first pulse generator 102 at node n1 and generates a second clock pulse for the two pulse sequence based on the one or more input signals (clken, inclkb). As shown, the second pulse generator 104 may include a single stack clock driver 106 that provides an output clock signal (ngtp) having the two pulse sequence. The single stack clock driver 106 may include a single transistor T1 that operates as the single stack clock driver. In some instances, the single transistor T1 may be implemented with an N-type metal-oxide semiconductor (NMOS) transistor. However, in other instances, the single transistor T1 may be implemented with a P-type MOS (PMOS) transistor. Further, in some instances, the two pulse sequence may be implemented with a negative global timing pulse (NGTP) for double-pumped memory applications. In some instances, the second pulse generator 104 may implement a second NGTP clock generator with the single stack clock driver 106 along with latch circuitry 108, which may be referred to as an ngtp latching mechanism.

The clock generating circuitry 100 may include an input circuit 110 having one or more logic gates (e.g., a NOR gate) arranged in sequence to receive the one or more input signals (clken, inclkb) and provide an activation signal (ctrb) to the single stack clock driver (e.g., transistor T1). For instance, as shown, the NOR gate 110 may provide the activation signal (ctrb) to a gate of the single stack clock driver 106 (e.g., transistor T1).

As shown in FIG. 1, the first pulse generator 102 may include logic devices T2, M1, M2 that are arranged to receive a reset signal (reset), a first clock signal (clka), and a first control signal (ctra) and provide the output clock signal (ngtp) at node n1. The reset signal (reset) may refer to a memory tracking signal that closes the NGTP pulse with a rising edge. As shown, a gate of the transistor T2 receives the reset signal (reset) as an activation signal, a gate of the transistor M1 receives the first clock signal (clka), and a gate of the transistor M2 receives the first control signal (ctra). The generation of this reset signal is determined through the self-timed pulse generation.

A self-timed clocked memory may typically take its input from a clock. It may use only the starting edge of this input to generate an internal starting clock input. This internal clock input then generates a number of sequential signals that model the timing delay of the critical path of the individual memory components. The reset of different paths of these signals is dependent upon a completion of at least one particular event. Once the completion of the particular event occurs, then a reset signal is generated which resets the path independent of the second clock edge. A typical chain of events involves: clock generation (ngtp generation), address latching or decoding which results in a generation of a word line (in this case we move from ngtp generation to a dummy WL, or emulated word line), the word line then has an RC path that is emulated, and then a bitline RC discharge path is also emulated. This bitline discharge path then typically may do two things, it may trigger the reset of the internal clock timing signal (i.e. the reset signal is sent back to the first pulse generator and latch such that ngtp is restored to a one "1", and the latch is reset) such that the wordline is reset, and it may also generate the initiation of the setting of the sense amplifier. A dummy word line and dummy bit line path may be used to emulate the actual word line and bit line. This type of self-timed pulse generation circuitry may be referred to as self-timed because there is a completion path that emulates the time when it is safe to start resetting the individual segments.

In some implementations, the single stack driver 106 (transistor T1) may reduce a total driver fin count, e.g., from 160 fins to 40 fins, thus simplifying any extra logic that may be used to drive the NGTP load. The signal (ctrb) may include a clock signal and an enable signal built in to it. There may be no extra timing penalty for the signal (ctrb), since the input signal (clken) is latched with a rising edge of an external clock for double-pumped memory (e.g., in reference to a second port B), and it may be margined to meet an internal setup to the input signal (inclkb), which may be created from a rising edge of the first clock pulse in the two pulse sequence of (NGTP).

Generally, where performance is not critical, the single stack clock driver may replace two-stack clock driver to save area and clock power. As shown in FIG. 1, the single stack driver for the second pulse generator may be driven by a NOR gate, this same structure could be repeated for the first pulse generator, by replacing T2, M1, M2 with a circuit (D3) having a NAND gate followed by an inverter that drives a single stack device (D2), which provides tolerance to variation since input load on a CLK pin is reduced significantly. More detail provided herein below in reference to FIG. 2C. As such, the single stack driver may replace a two-stack driver to reduce a per cycle clock switching power.

As also shown in FIG. 1, the NOR gate 110 of the second pulse generator 104 receives the input signals (clken, inclkb) and provides the activation signal (ctrb) to the single stack clock driver (e.g., transistor T1). In this instance, the single stack clock driver (e.g., transistor T1) provides the second clock pulse based on the activation signal (ctrb). As described herein, second clock pulse negative edge is derived from closing edge of first pulse and provided in the two pulse sequence as the output signal from the transistor T1 (e.g., as the single stack clock driver). In this instance, the output signal (ngtp) that is provided by the transistor T1 may be implemented as the negative global timing pulse (NGTP) for double-pumped memory applications.

The clock generating circuitry 100 may include the latch circuitry 108 that is shared with the first pulse generator 102 and the second pulse generator 104. The latch circuitry 108 may be referred to as an ngtp latch. As shown in FIG. 1, the latch circuitry 108 may include logic devices M3, M4, M5, M6, M7, T3, T4, T5, T6 that are arranged to receive various input signals (clka, clkb, ctra, ctrb, feed, reset) and provide a latching mechanism for latching ngtp. For instance, transistor pair M3, M4 are coupled in parallel with transistor pair M5, M6, and transistor M7 is coupled between these transistor pairs and node n1. Also, transistor T3 is coupled between node n1 and transistor T4. Further, transistors T5, T6 are coupled to operate as an inverter so as to receive the ngtp signal as an input from node n1 and then provide an output signal to a gate of transistor T4. The output signal from the inverter (T5, T6) may be referred to as the feed signal.

The clock generating circuitry 100 may be implemented as an integrated circuit (IC) in various types of memory, such as, e.g., random access memory (RAM), including static RAM (SRAM), and/or any other types of volatile memory. In some cases, the clock generating circuitry 100 may be implemented as an IC with single, dual and/or multi port memory architecture, including various double-pump memory applications. The clock generating circuitry 100 may be integrated with computing circuitry and any related components on a single chip, such as, e.g., system-on-a-chip (SoC) applications. The clock generating circuitry 100 may be implemented in embedded systems for various electronic and mobile applications, including low power sensor nodes for IoT (Internet of things) applications.

Figure 2A:
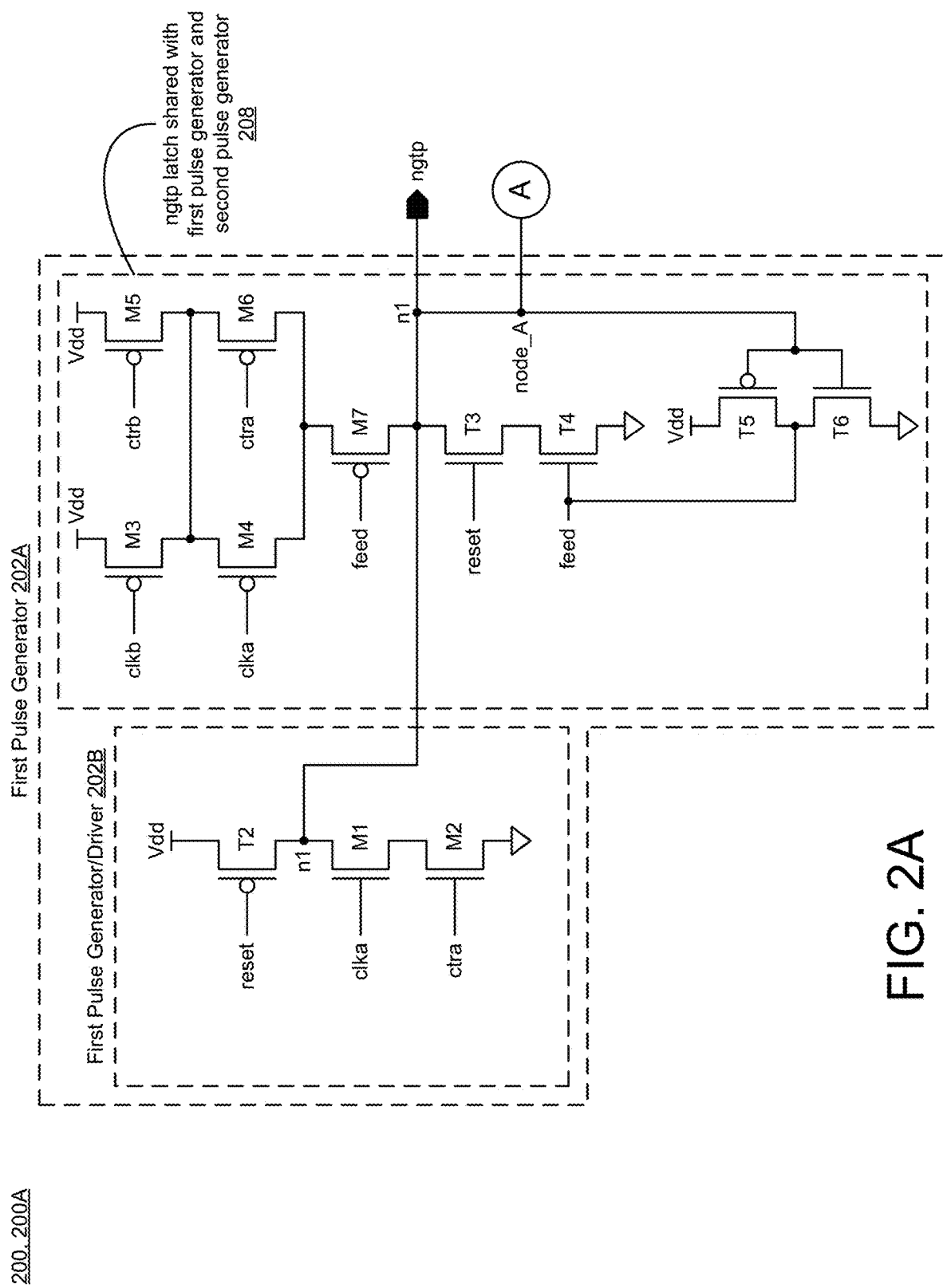
FIGS. 2A-2C illustrate another diagram of clock generating circuitry in accordance with various implementations described herein.
Figure 2B:
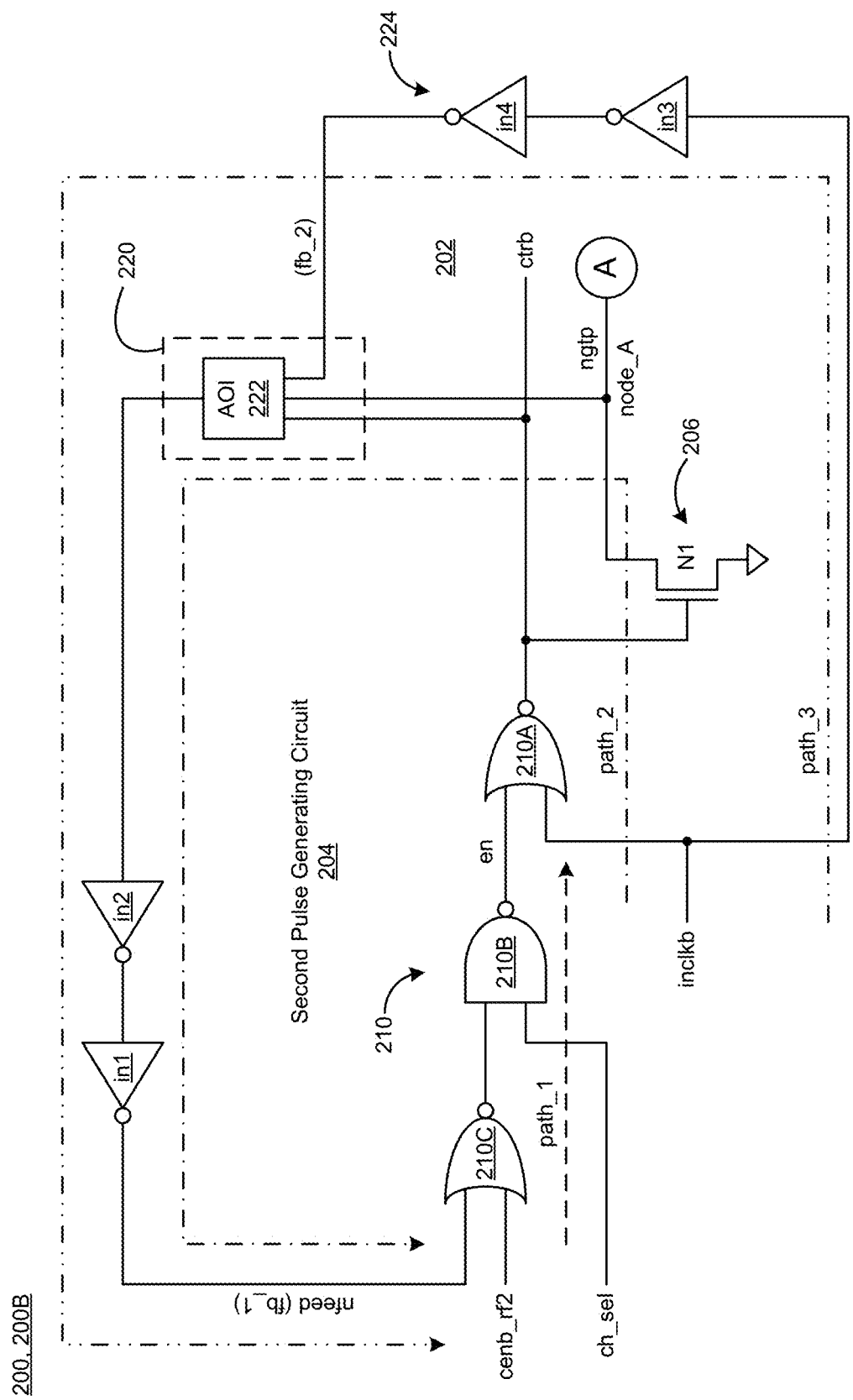
Figure 2C:
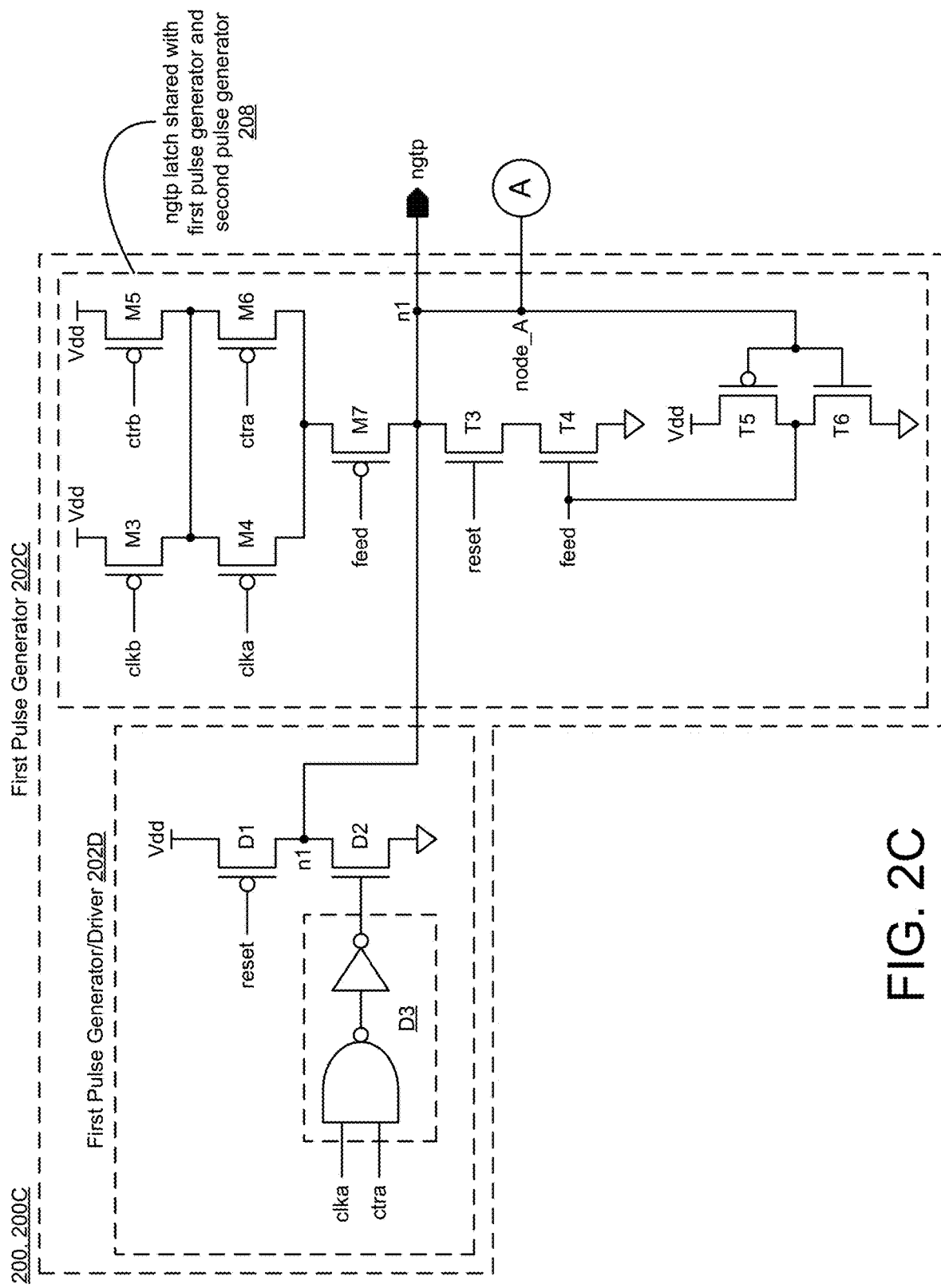

FIGS. 2A-2C illustrate various diagrams of clock generating circuitry 200 in accordance with various implementations described herein. In particular, FIG. 2A illustrates a first portion (or part) 200A of the clock generating circuitry 200, and FIG. 2B illustrates a second portion (or part) 200B of the clock generating circuitry 200, which are coupled together via node_A (i.e., as shown with circle A). Also, FIG. 2C illustrates another implementation 200C of the first portion (or part) of the clock generating circuitry 200, which is also coupled together via node_A. Various components that are described in FIGS. 2A-2C are similar in scope, function, and operation as described in reference to the circuitry 100 as shown in FIG. 1.

As shown in FIG. 2A, the clock generating circuitry 200A may include a first pulse generating circuit 202A that generates a first pulse for a two pulse global timing sequence (ngtp) based on multiple input clock signals (reset, clka, ctra). As shown, the first pulse generating circuit 202A includes a first pulse generator (or driver) 202B that is similar to the first pulse generator 102 of FIG. 1. Also, the first pulse generating circuit 202A includes a latch circuit 208 that is similar to the latch circuitry 108 of FIG. 1.

As shown in FIG. 2B, the clock generating circuitry 200 may include a second pulse generating circuit 204 that is coupled to the first pulse generating circuit 202A at node_A and generates a second pulse for the two pulse global timing pulse sequence based on the multiple input clock signals (inclkb, cenb_rf2, ch_sel, fb_1). As shown, (fb_1) refers to a first feedback signal. In some instances, the first pulse may be derived from a closing edge of the first pulse and based on a state of cenb_rf2 and ch_sel, and the second pulse may be generated from inclkb. In some implementations, the second pulse generating circuit 204 may include a single stack clock driving circuit 206 that provides a negative global timing pulse (NGTP) signal having the two pulse global timing sequence (ngtp) with the first pulse and the second pulse.

In some implementations, the single stack clock driving circuit 206 may include a single transistor N1 that operates as the single stack clock driver. In some instances, the single transistor N1 may be implemented with an NMOS transistor. However, in other instances, the single transistor N1 may be implemented with a PMOS transistor. Further, as described herein, the two pulse global timing sequence may be implemented with the negative global timing pulse (NGTP) for double-pumped memory applications.

In some implementations, the clock generating circuitry 200 may also include an input circuit 210 having multiple logic gates 210A, 210B, 210C that are arranged in sequence to receive the multiple input signals (inclkb, cen_rf2, ch_sel, fb_1) and provide the activation signal (ctrb) to the single stack clock driving circuit 206. In some instances, the multiple logic gates 210A, 210B, 210C of the input circuit 210 may include a NAND gate 210B and multiple NOR gates 210A, 210C.

In some implementations, the clock generating circuitry 200 may also include a first feedback circuit 220 having at least one logic gate 222, along with inverters in1, in2, that are arranged in sequence to receive the activation signal (ctrb), the negative global timing pulse (NGTP) signal, and a second feedback signal (fb_2) and provide the first feedback signal (fb_1) to the input circuit 210 as one of the multiple input signals (inclkb, cenb_rf2, ch_sel, fb_1). In some instances, the at least one logic gate 222 of the first feedback circuit 220 may include an AND-OR-Invert (AOI) single inversion gate (which is gate 222, along with multiple inverters (in1, in2), such as, e.g., a first inverter (in1) and a second inverter (in2). In some instances, the first feedback circuit 220 may be implemented as a single stage of inversion, In various instances, any type of logic gate may be used to provide a single stage of inversion.

In some implementations, the clock generating circuitry 200 may also include a second feedback circuit 224 having multiple logic gates (in3, in4) that are arranged in sequence to receive at least one input signal (inclkb) of the multiple input signals (inclkb, cenb_rf2, ch_sel, fb_1) and provide the second feedback signal (fb_2) to the at least one logic gate 222 of the first feedback circuit 220. As described above, the at least one logic gate 222 of the first feedback circuit 220 may be implemented with an AOI single inversion gate. For Instance the signals CTRB and NGTP are ANDED together and their output is OR-Invert with fb_2. The multiple logic gates (in3, in4) of the second feedback circuit 224 may include multiple inverters, such as, e.g., a third inverter (in3) and a fourth inverter (in4).

In some implementations, the input signal (ch_sel) may refer to a bank select signal and the input signal (cenb_rf2) may refer to a port select signal. Further, a falling edge of the input signal (inclkb) may be used to generate a rising edge of the signal (ctrb), which may be used for triggering a start of a falling edge of the second pulse in the two pulse sequence for the ngtp pulse signal. Also, in some instances, the first and/or second feedback circuits 220, 224 may be used to close the pulse of the (ctrb) signal.

Further, as shown in reference to FIG. 2B, there are three main signal paths (path_1, path_2, path_3) for the clock generating circuitry 200. For instance, path_1 refers to a first signal path from cenb_rf2 and ch_sel to en. The first signal path (path_1) refers to a two signal (cenb_rf2 and ch_sel) setup path to inclkb. In another instance, path_2 refers to a second signal path from an inclkb falling transition to an nfeed rising transition. The second signal path (path_2) refers to setting the enable signal (en) to high to disable the second ngtp generator 204, so that the ngtp signal will be latched in the first ngtp generator 202. In another instance, path_3 refers to a third path from an inclkb rising transition to an nfeed falling transition. In some instances, the latch circuit 208 itself may be thought of as a shared latch associated with either or neither the first pulse generator 202A or the second pulse generator 204. The third path (path_3) refers to enabling the first path (path_1) for the two signal (cenb_rf2 and ch_sel) setup.

As shown in FIG. 2C, the clock generating circuitry 200C may include a first pulse generating circuit 202C that generates the first pulse for the two pulse global timing sequence (ngtp) based on multiple input clock signals (reset, clka, ctra). The first pulse generating circuit 202C includes a first pulse generator (or driver) 202D. Also, the first pulse generating circuit 202C may include the latch circuit 208 that is similar to the latch circuitry 108 of FIG. 1. As shown, the first pulse generator 202D may include multiple logic devices, including, e.g., PMOS transistor (D1), NMOS transistor (D2), and NAND gate (D3), which are arranged to generate the first pulse for the two pulse global timing sequence (ngtp) at node n1. In various implementations, the first pulse generator 202D may provide an alternative usage for the single stack clock pulse driver. For instance, this arrangement of logic devices (D1, D2, D3) in FIG. 2C may be used to provide more tolerance to clock variation and low power applications. This feature may also be used in a memory design that only has a single pulse generator for a single pulse. FIG. 2C shows how the clock can be generated from a single device. This helps reduce the clock loading and the variation due to clock slew at the expense of increasing the delay. Thus this technique is extendable to a single pulse generator for a single clocked RAM.

In some implementations, the latch circuit 208 may be shared between the first and second pulse generators 202A, 204. At any given time, only one of the first or second pulse generators 202A, 204 may be active. In other implementations, the latch circuit 208 may not be shared between the first and second pulse generators 202A, 204 and both may use latches that are only associated to them. However, two separate latch circuits may be area inefficient, and hence, a shared latch is more efficient and thus implemented.

Figure 3A:
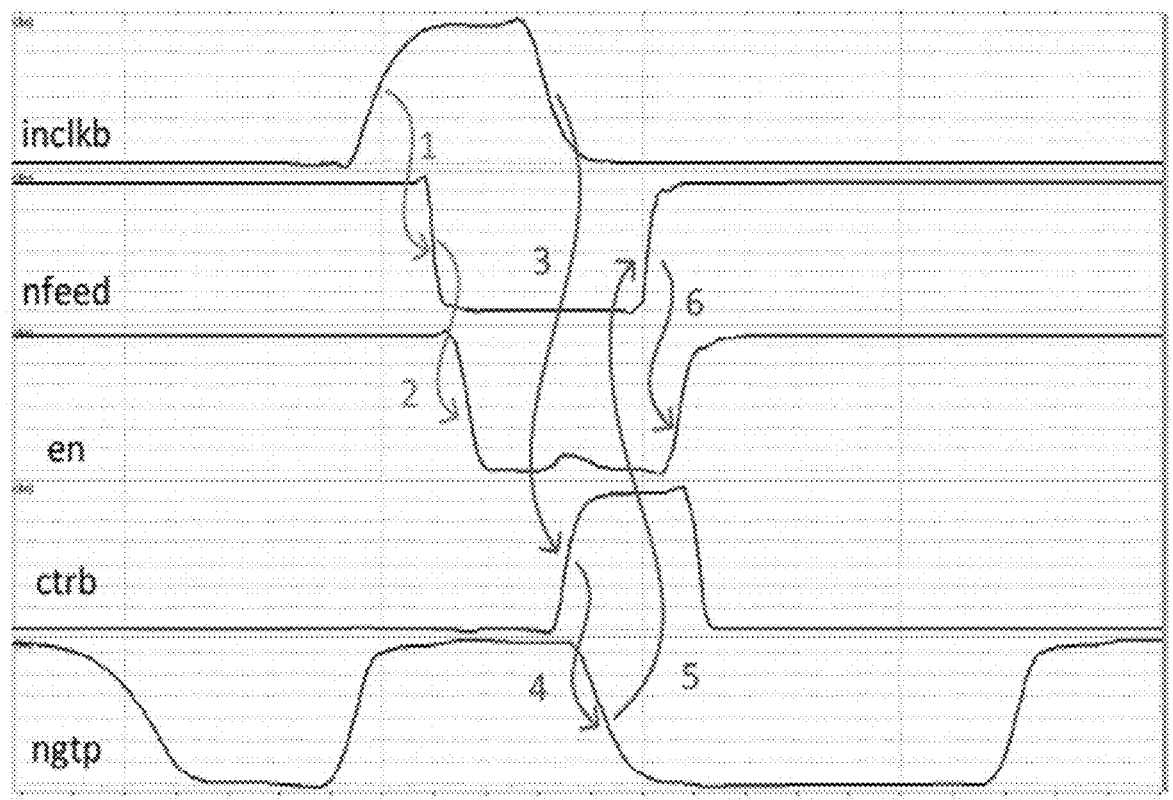
FIGS. 3A-3D illustrate various diagrams of timing graphs and related circuitry in accordance with various implementations described herein.
Figure 3B:
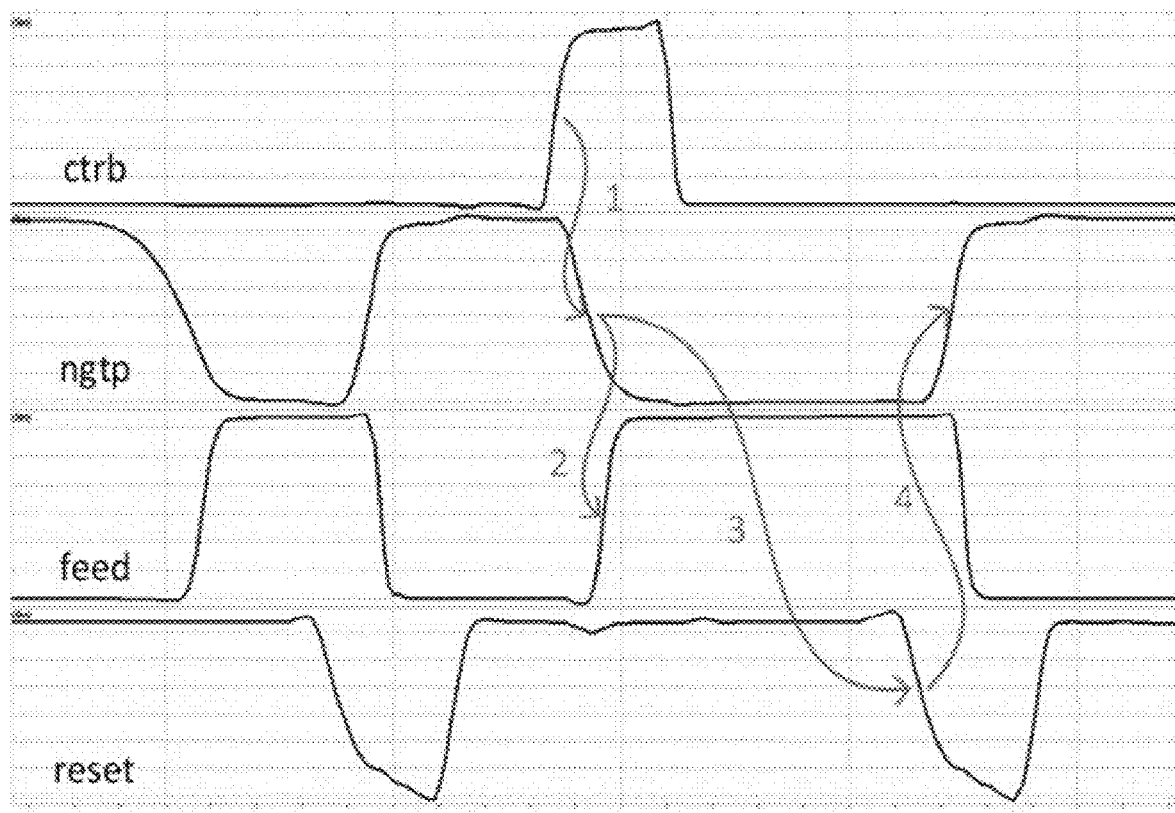
Figure 3C:
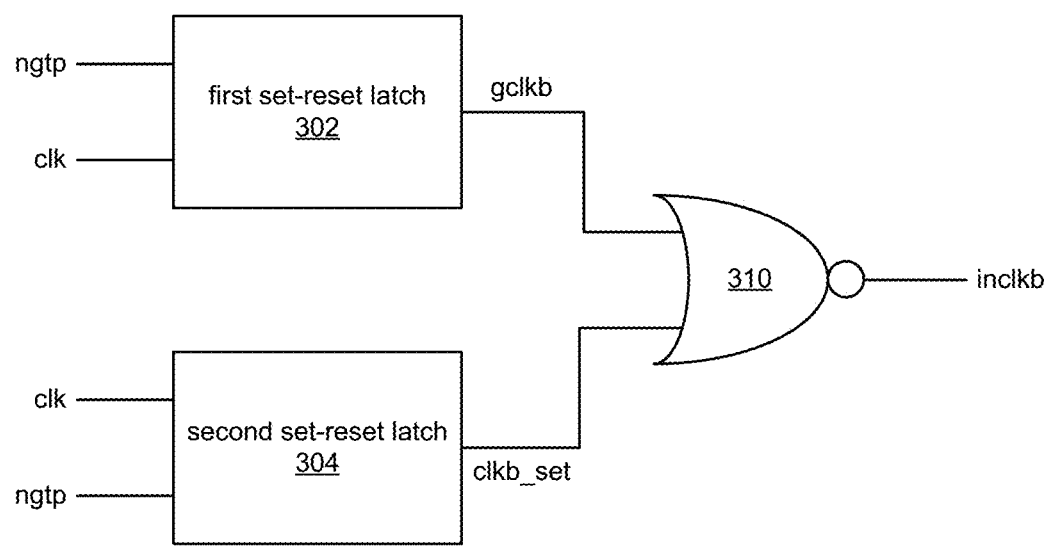

FIGS. 3A-3C illustrate various diagrams of timing graphs in accordance with various implementations described herein. In particular, FIG. 3A illustrates a first timing diagram 300A for the second path (path_2) and the third path (path_3) as described above in reference to FIG. 2. FIG. 3B illustrates a second timing diagram 300B for the first path (path_1) as described above in reference to FIG. 2. Further, FIG. 3C illustrates a third timing diagram 300C for triggering the input signal (inclkb) as also described above in reference to FIG. 2.

As shown in the diagram 300A of FIG. 3A, transition 1 and transition 2 refer to a signal flow for the third path (path_3), where the inclkb rising transition triggers the nfeed falling transition to thereby enable the setup path of the first path (path_1), and the enable signal (en) falls after the nfeed signal falls. Further, as shown, transitions 3-6 refer to a signal flow for the second path (path_2), where inclkb falls to thereby trigger the ctrb signal to rise, which generates the ngtp falling edge. After generating the ngtp falling edge, the nfeed signal is set to high and blocks the setup path of the first path (path_1), so that the enable signal (en) goes high.

As shown in the diagram 300B of FIG. 3B, transition 1 and transition 2 refer to an ngtp latch. For instance, when the ctrb signal goes high, this triggers the ngtp signal to fall, which is followed by the feed signal rising. Further, as shown, the feed signal rising edge will enable a pull-down path for the ngtp signal, which latches ngtp low until the reset signal goes low (see FIG. 1 for the feed signal latching ngtp low). Also, transition 3 in FIG. 3B refers to the generation of the reset signal (reset). This reset signal may be similar to as the reset signal in 102 of FIG. 1. This reset signal may be a signal internal to memory, and the reset signal may be generated from the falling edge of ngtp when undergoing tracking for self-timed pulse. Further, transition 4 refers to generation of the rising edge for ngtp from the reset falling edge. This functionality may be represented by device T2 in 102 of FIG. 1.

Figure 3D:
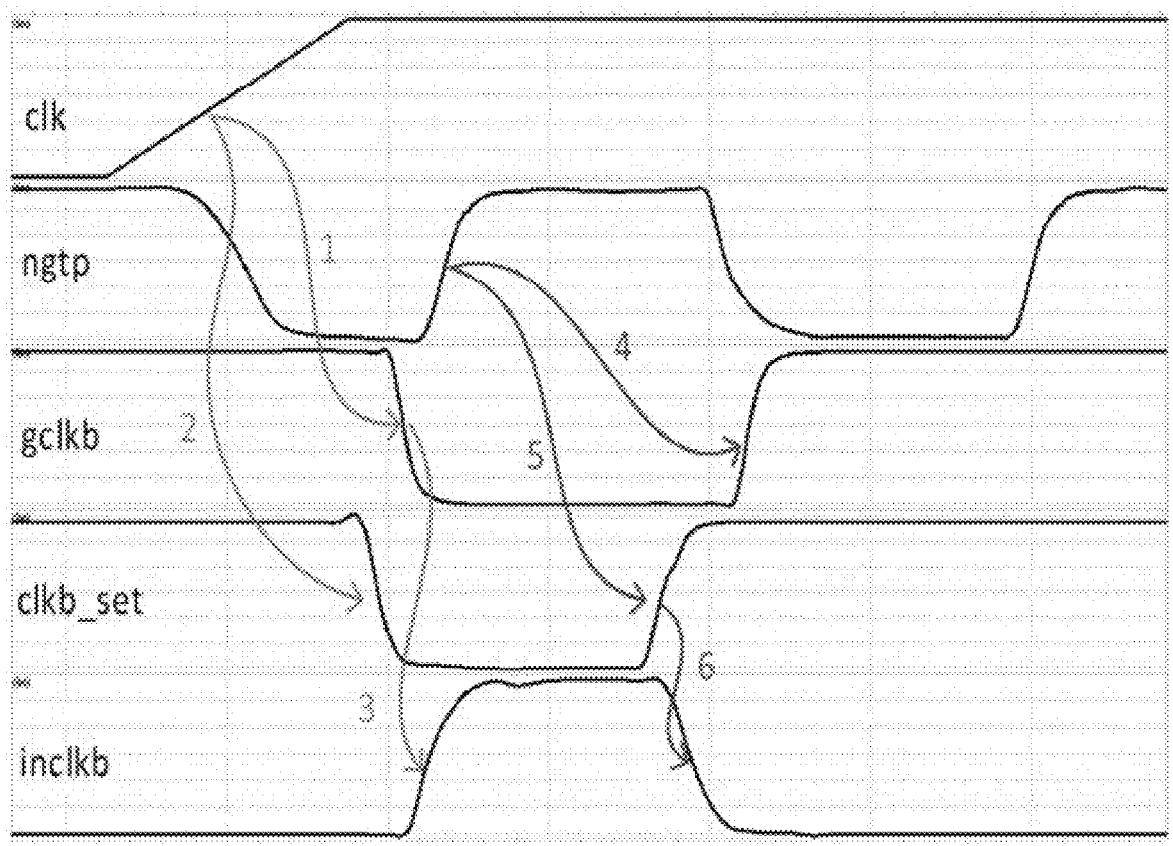

As shown in the diagram 300C of FIG. 3C, a first set-reset (SR) latch 302 and a second set-reset (SR) latch 304 may be arranged to receive ngtp and a clock signal (clk) and provide signals (gclkb, clkb_set) to a logic gate 310 to thereby generate the inclkb signal. For instance, the first SR latch 302 may receive ngtp and clk and then provide gclkb to the logic gate 310, and the second SR latch 304 may receive ngtp and clk and then provide clkb_set to the logic gate 310. In some instance, the logic gate 310 may be implemented with a NOR gate. In this instance, the logic gate 310 may receive gclkb and clkb_set and then provide inclkb. FIG. 3D herein below discusses the timing waveforms of the signals: clk, ngtp, gclkb, clkb_set, and inclkb.

As shown in the diagram 300D of FIG. 3D, the clock signal (clk) rising edge triggers the clkb_set signal falling edge and the gclkb signal falling edge. Further, as shown, the slower transition between those two signals (clkb_set and gclkb) will trigger the inclkb signal rising edge. As shown in FIG. 3D, transitions 1 and 2 provide a rising edge of clk (same as clka in 102 of FIG. 1) that provides the falling edge of gclkb and clkb_set. Transition 3 provides the falling edge in gclkb and clkb_set that provides the rising edge of inclkb. Also, transitions 1, 2 and 3 refer to a reset operation of the second pulse generator that results in nfeed (i.e., nfeed(fb_1) in FIG. 2B) being cleared to logic value zero, which allows the enable signal (i.e., en in FIG. 2B) to setup to inclkb. Transitions 4 and 5 provide the rising edge of the first ngtp pulse, which provides the rising edge of gclkb and clkb_set. Transition 6 provides the rising edge of clkb_set, which provides the falling edge of inclkb, which triggers the creation of second ngtp pulse. Also, transitions 4, 5 and 6 contribute to creation of the falling edge of inclkb (FIG. 2B), which eventually creates the second ngtp pulse.

Figure 4:
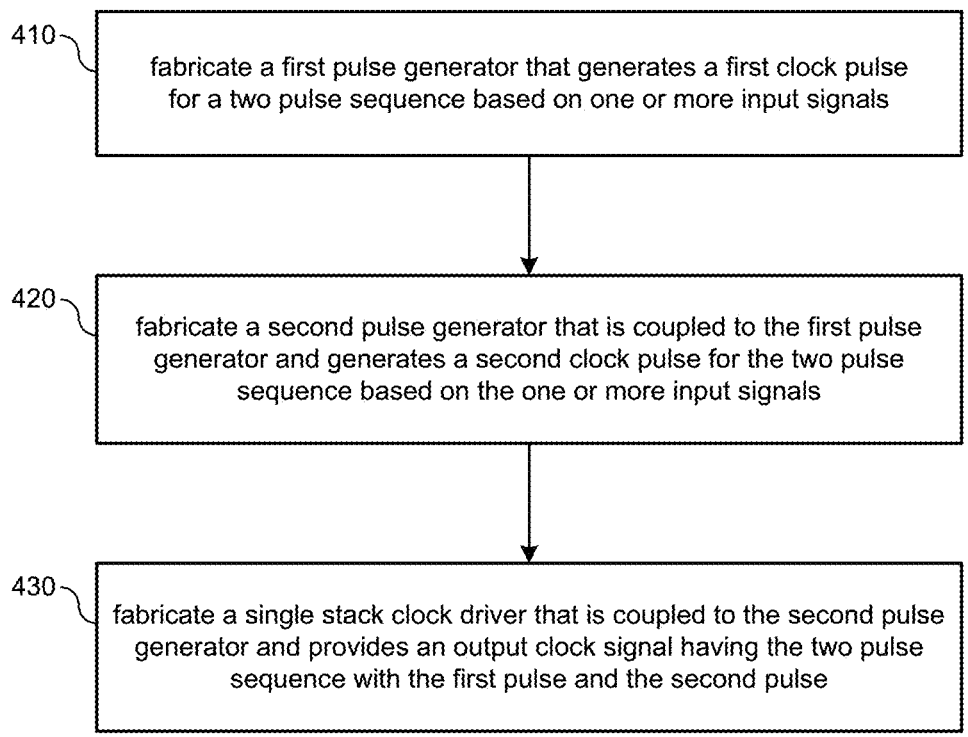
FIG. 4 illustrates a process flow diagram of a method for manufacturing an integrated circuit in accordance with various implementations described herein.

FIG. 4 illustrates a process flow diagram of a method 400 for manufacturing an integrated circuit in accordance with various implementations described herein.

It should be understood that even though method 400 may indicate a particular order of operation execution, in some cases, various certain portions of the operations may be executed in a different order, and on different systems. In other cases, additional operations and/or steps may be added to and/or omitted from method 400. Method 400 may be implemented in hardware and/or software. If implemented in hardware, the method 400 may be implemented with various circuit components, such as described herein above in reference to FIGS. 1-3C. If implemented in software, method 400 may be implemented as a program or software instruction process that may be configured for implementing clock generating circuitry as described herein. Further, if implemented in software, instructions related to implementing the method 400 may be stored in memory and/or a database. For instance, a computer or various other types of computing devices having a processor and memory may be configured to perform method 400.

As described and shown in reference to FIG. 4, method 400 may be used for manufacturing an integrated circuit (IC) that implements clock generating circuitry in various types of memory applications.

At block 410, method 400 may fabricate a first pulse generator that generates a first clock pulse for a two pulse sequence based on one or more input signals. In some implementations, the two pulse sequence may be a negative global timing pulse (NGTP) for double-pumped memory applications.

At block 420, method 400 may fabricate a second pulse generator that is coupled to the first pulse generator and generates a second clock pulse for the two pulse sequence based on the one or more input signals.

At block 430, method 400 may fabricate a single stack clock driver that is coupled to the second pulse generator and provides an output clock signal having the two pulse sequence with the first pulse and the second pulse. In some implementations, the single stack clock driver may be a single transistor that operates as the single stack clock driver. Further, the single transistor may be implemented with an N-type metal-oxide semiconductor (NMOS) transistor.

In some implementations, method 400 may also fabricate an input circuit having multiple logic gates arranged in sequence to receive the one or more input signals and provide an activation signal to the single stack clock driver. The multiple logic gates of the input circuit may be implemented with a NAND gate and multiple NOR gates.

In some implementations, method 400 may also fabricate a first feedback circuit having multiple logic gates arranged in sequence to receive the activation signal and the output clock signal and provide a first feedback signal as the one or more input signals. The multiple logic gates of the first feedback circuit may be implemented with a AND gate, a NOR gate, and/or multiple inverters. In some instances, the first feedback circuit may be implemented with an AND-OR-Invert (AOI) single inversion gate, wherein the first feedback circuit may be implemented with a single stage of inversion. Also, in various instances, the AND gate may be implemented logically with an AND operation, and the NOR gate may be implemented logically with a NOR operation.

In some implementations, method 400 may also fabricate a second feedback circuit having multiple logic gates arranged in sequence to receive at least one input signal of the one or more input signals and provide a second feedback signal to at least one logic gate of the multiple logic gates of the first feedback circuit. The multiple logic gates of the second feedback circuit may be implemented with multiple inverters.

Described herein are various implementations of an integrated circuit. The integrated circuit may include a first pulse generator that generates a first clock pulse for a two pulse sequence based on one or more input signals. The integrated circuit may include a second pulse generator that is coupled to the first pulse generator and that generates a second clock pulse for the two pulse sequence based on the one or more input signals. The second pulse generator has a single stack clock driver that provides an output clock signal having the two pulse sequence.

Described herein are various implementations of an integrated circuit. The integrated circuit may include a pulse generating circuit that generates a pulse for a global timing sequence based on at least one input clock signal. The pulse generating circuit has a single stack clock driving circuit that provides a negative global timing pulse (NGTP) signal with the pulse as at least one clock pulse per cycle for the global timing sequence.

Described herein are various implementations of a method for manufacturing an integrated circuit. The method may include fabricating a first pulse generator that generates a first clock pulse for a two pulse sequence based on one or more input signals. The method may include fabricating a second pulse generator that is coupled to the first pulse generator and that generates a second clock pulse for the two pulse sequence based on the one or more input signals. The second pulse generator has a single stack clock driver that provides an output clock signal having the two pulse sequence.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a first pulse generator that generates a first clock pulse for a two pulse sequence based on one or more input signals; and
   a second pulse generator that is coupled to the first pulse generator and that generates a second clock pulse for the two pulse sequence based on the one or more input signals, wherein the second pulse generator has a single stack clock driver that provides an output clock signal having the two pulse sequence.

2. The integrated circuit of claim 1, wherein the two pulse sequence comprises a negative global timing pulse (NGTP) for double-pumped memory applications.

3. The integrated circuit of claim 1, wherein the single stack clock driver comprises a single transistor that operates as the single stack clock driver, and wherein the single stack clock driver is used to save area and clock power by reducing per cycle clock switching power.

4. The integrated circuit of claim 3, wherein the single transistor comprises an N-type metal-oxide semiconductor (NMOS) transistor.

5. The integrated circuit of claim 1, further comprising an input circuit having multiple logic gates arranged in sequence to receive the one or more input signals and provide an activation signal to the single stack clock driver.

6. The integrated circuit of claim 5, wherein the multiple logic gates of the input circuit include a NAND gate and multiple NOR gates.

7. The integrated circuit of claim 5, further comprising a first feedback circuit having multiple logic gates arranged in sequence to receive the activation signal and the output clock signal and provide a first feedback signal as the one or more input signals.

8. The integrated circuit of claim 7, wherein the multiple logic gates of the first feedback circuit include an AND-OR-Invert (AOI) single inversion gate and multiple inverters.

9. The integrated circuit of claim 7, further comprising a second feedback circuit having multiple logic gates arranged in sequence to receive at least one input signal of the one or more input signals and provide a second feedback signal to at least one logic gate of the multiple logic gates of the first feedback circuit.

10. The integrated circuit of claim 9, wherein the single stack clock driver is driven by a logic gate to thereby provide tolerance to variation since an input load on a clock input pin is reduced significantly, and wherein the logic gate is implemented with an AND gate.

11. An integrated circuit, comprising:
a pulse generating circuit that generates a pulse for a global timing sequence based on at least one input clock signal,
wherein the pulse generating circuit has a single stack clock driving circuit that provides a negative global timing pulse (NGTP) signal with the pulse as at least one clock pulse per cycle for the global timing sequence.

12. The integrated circuit of claim 11, wherein the global timing sequence comprises a two pulse global timing sequence, and further comprising:
an additional pulse generating circuit that generates another pulse prior to the pulse for the two pulse global timing sequence based on multiple input clock signals,
wherein the additional pulse generating circuit is coupled to the pulse generating circuit that generates the pulse for the two pulse global timing sequence based on the multiple input clock signals, and
wherein the single stack clock driving circuit and the additional pulse generating circuit provide the NGTP signal having the two pulse global timing sequence with the prior pulse and the pulse.

13. The integrated circuit of claim 12, wherein the single stack clock driving circuit comprises a single transistor that operates as the single stack clock driver, and wherein the single stack clock driver is used to save area and clock power by reducing per cycle clock switching power.

14. The integrated circuit of claim 12 further comprising an input circuit having multiple logic gates arranged in sequence to receive the multiple input signals and provide an activation signal to the single stack clock driving circuit.

15. The integrated circuit of claim 14, wherein the multiple logic gates of the input circuit include a NAND gate and multiple NOR gates.

16. The integrated circuit of claim 14, further comprising a first feedback circuit having multiple logic gates arranged in sequence to receive the activation signal and the negative global timing pulse (NGTP) signal and provide a first feedback signal to the input circuit as one of the multiple input clock signals.

17. The integrated circuit of claim 16, wherein the multiple logic gates of the first feedback circuit includes an AND-OR-Invert (AOI) single inversion gate and multiple inverters.

18. The integrated circuit of claim 16, further comprising a second feedback circuit having multiple logic gates arranged in sequence to receive at least one input signal of the multiple input signals and provide a second feedback signal to at least one logic gate of the multiple logic gates of the first feedback circuit.

19. The integrated circuit of claim 18, wherein the single stack clock driving circuit is driven by a logic gate to thereby provide tolerance to variation since an input load on a clock input pin is reduced significantly, and wherein the logic gate is implemented with an AND gate.

20. A method for manufacturing an integrated circuit, comprising:
fabricating a first pulse generator that generates a first clock pulse for a two pulse sequence based on one or more input signals; and
fabricating a second pulse generator that is coupled to the first pulse generator and that generates a second clock pulse for the two pulse sequence based on the one or more input signals, wherein the second pulse generator has a single stack clock driver that provides an output clock signal having the two pulse sequence.

* * * * *